United States Patent Office 3,439,855

Patented Apr. 22, 1969

3,439,855

METHOD AND APPARATUS FOR THERMALLY BONDING SEMICONDUCTOR COMPONENTS TO CARRIERS

Heinz-Herbert Arndt, Nuremberg, and Jürgen Schädel, Erlangen, Germany, assignors to Siemens Aktiengesellschaft, Erlangen, Germany Filed July 13, 1966, Ser. No. 564,910
Claims priority, application Germany, July 16, 1965, S 98,233
Int. Cl. B23k *19/00, 37/04*
U.S. Cl. 228—44 10 Claims

ABSTRACT OF THE DISCLOSURE

Entrainer device in apparatus for thermally bonding a substantially flat semiconductor element to a support includes means for holding the semiconductor element at the edges thereof, the entrainer device being rotatable relative to the support about an axis perpendicular to the semiconductor element.

Our invention relates to apparatus for thermally bonding semiconductor components to carriers and more particularly to thermally bonding rectangular platelet or pellet-shaped components metallically onto carriers by means of an entraining device which imparts relative motion between the semiconductor platelet and the carrier.

Semiconductor components, especially those having p-n junctions and protective layers which must not be damaged, are generally very sensitive to mechanical stresses. Very powerful mechanical effects are produced, however, in a process wherein a completed semiconductor component element is to be secured or bonded to a carrier such as a support or a housing, for example.

With many semiconductor components, this bonding takes place by alloying the semiconductor element to the carrier material or by soldering with a metallic layer located for this express purpose between the semiconductor element and the carrier. In order to be able to reliably alloy or solder larger areas, for example silicon platelets to a gilded substrate, the carrier and semiconductor element must be moved relative to one another after the melting point of the alloying material or of the solder is attained. It is just this "rubbing" of the semiconductor element and the carrier against one another which effects a uniform and intimate contact therebetween.

Devices which effect the adjustment of the semiconductor element on its carrier and which perform the accompanying alloying or soldering operation are known in great numbers. All of the known devices have the common feature that the semiconductor element is held by suction applied through a hollow needle, and with suitable devices the needle and the semiconductor element are brought to the carrier in the desired position and there lowered onto the carrier. After the carrier and semiconductor element have reached the necessary temperature, the hollow needle is set into a vibratory motion that is for the most part irregular. By means of this vibration, the semiconductor element sucked against the needle is rubbed back and forth upon the carrier until a sufficient quantity of the liquid phase thereof is formed due to the heat engendered by friction. Cooling is then applied thereto until the semiconductor and carrier are firmly connected to one another by the hardening or solidification of the alloy or the solder. Many proposals have been made as to how to construct the mouthpiece of the hollow needle and several different types have actually been produced. All of these types can be arranged in two groups.

In one of the groups, the needle is simply ground at its tip perpendicularly to the longitudinal axis thereof and is brought into engagement with the semiconductor element on the delicate or sensitive surface thereof. With needle-types of this group, relative motion between the semiconductor element and the needle and the danger of consequent damage cannot be avoided. In order to transfer the motion of the needle to the component, a relatively high suction pressure is necessary.

In the other of the two groups, the needle is provided with a mouthpiece simulatin gthe shape of the semiconductor element and engaging the semiconductor element solely at the upper edges or the side surfaces thereof. Since the vibratory motion permits only very small amplitudes, the mouthpiece must enclose the semiconductor very tightly in order to transfer the motion of the needle actually to the semiconductor element. This requires exceptional and costly precautions in order to maintain the tolerances of the semiconductor dimensions at small values since the tolerances must not exceed the order of magnitude of the vibration amplitude.

Both of the foregoing known groups of devices have the additional disadvantage in common that each semiconductor component element must be separately adjusted on the carrier before alloying or soldering, or a device must be provided for placing the components on the carrier with accurate adjustment.

It is accordingly an object of our invention to provide method and apparatus for thermally bonding semiconductor components onto carriers which avoid the foregoing disadvantages of the known types of devices and methods.

With the foregoing and other objects in view, we provide in accordance with our invention method for thermally bonding semiconductor components such as rectangular platelets onto carriers, and apparatus for carrying out the method comprising an entrainer device which imparts to the semiconductor platelets a relative motion with respect to the carrier. The entrainer device is rotatable relative to the carrier about an axis disposed perpendicular to the surface of the semiconductor platelet and holds the semiconductor platelet at the edges thereof. The entrainer device can end particularly in four points or tips extending symmetrically to the rotary axis, by means of which the semiconductor platelet is held at its edges while subjected to the rotary motion.

With this in mind there can be provided, for example, a tube having a crown-shaped lower end as the entrainer device. The entrainer device can also be formed of four pins placed in a holder each of which, for example, is staggered 90° apart from one another on the surface of an imaginary cone which is symmetrical to the rotary axis of the entrainer and tapers to a point in a direction toward the semiconductor platelet. The entrainer device can also be formed by the pointed portions that are produced by bending outwardly the four edges formed in the surface, for example, of a metal plate or sheet by a cross-shaped cut therein.

It is advantageous to make those portions especially of the entrainer device, which directly engage the semiconductor element or the carrier or come into the vicinity thereof, from a thermally stable and non-inflammable, or at least flame-resistant, material. Consequently, the entrainer device cannot become softened at the respective alloying or soldering temperature that is employed, and furthermore cannot become soiled because of the resistance of the semiconductor component against burning. Material suitable for the entrainer device, with the foregoing purpose in mind, is chrome-nickel-steel (i.e. a steel with 18% Cr and 8% Ni) or tungsten carbide. It is furthermore advantageous to make the pointed portions of the entrainer device which hold the semiconductor platelet and the portions directly bordering on those portions as thin as possible so that heat dissipation by the entrainer device does not markedly cool the semiconductor element.

By means of the apparatus of our invention, the aforementioned disadvantages of the two groups of the heretofore known apparatus-types are avoided by laterally gripping the semiconductor element and by rotating it clockwise and counterclockwise about its perpendicular axis in order to accelerate the soldering or alloying operation to the carrier and to effect a homogeneous bonding. It is particularly advantageous that the necessary gripping device permits easily maintainable tolerances of the dimensions of the semiconductor element. A further advantage of the apparatus of our invention is that the gripping device automatically assures adjustment of semiconductor elements of the most limited size, often less than 1 mm.$^2$, to the carrier. The semiconductor element is conveyed from the supply receptacle thereof to the gripping device, for example by means of a suction needle or a supply or feeding shaft or slideway.

Other features which are considered as characteristic for the invention are set forth in the appended claims.

Although the invention is illustrated and described herein as method and apparatus for thermally bonding semiconductor component elements to carriers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof, will be best understood from the following description of the method and specific embodiments of the apparatus for carrying out the method when read in connection with the accompanying drawings, in which.

Figure 1:
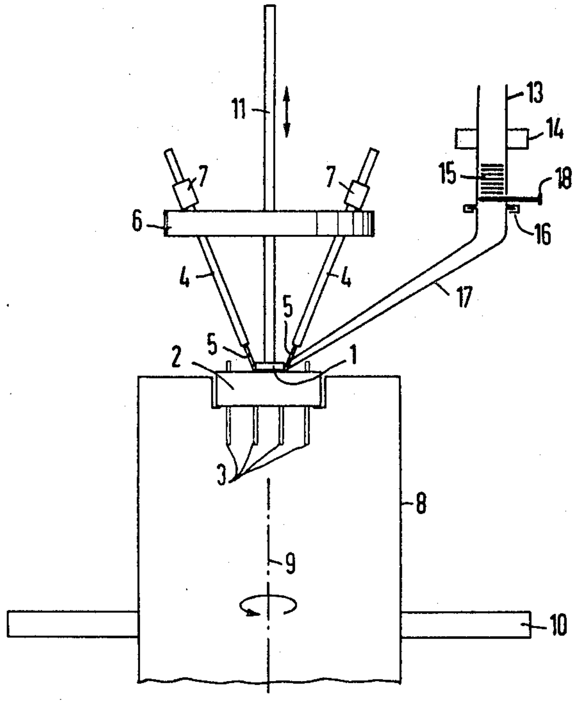
FIG. 1 is a diagrammatic plan view of the apparatus for thermally bonding semiconductor component elements to carriers in accordance with our invention wherein the entrainer device of our invention is provided with four pins disposed on the surface of an imaginary cone in a direction tapering toward the semiconductor.
Figure 2:
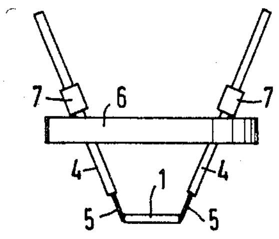
FIG. 2 and FIG. 3 are an elevational and a perspective view respectively of the entrainer device of FIG. 1.
Figure 3:
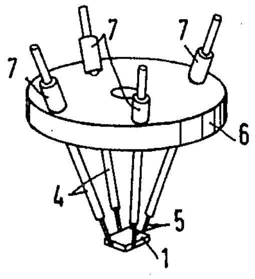

Referring now to the drawings and first particularly to FIGS. 1 to 3 thereof, there is shown a semiconductor element in the form of a platelet 1, lying on the carrier or housing 2 which is provided with leads 3 extending therethrough. The semiconductor element 1 is held on the carrier 2 by the points or tips 5 of pins 4 which are distributed on the surface of an imaginary cone. The pins 4 are inserted in a holder 6 and are arrested by adjusting sleeves 7. The pins 4 are adjustable by suitably displacing them in their longitudinal direction with respect to the holder 6 and by correspondingly displacing the adjusting sleeves 7 thereon so that a semiconductor platelet of specific size can be accommodated between the tips 5. The displaceable adjusting sleeves 7 may be suitably threaded on the pins 4 or can slidably adhere thereto by friction or the like. In the view of the entrainer device shown in FIG. 2, it can be seen how the pins 4 may be adjusted to accommodate semiconductor members of different dimensions from that shown in FIG. 1.

In the apparatus of FIG. 1, the entrainer device (with the pins 4) can be rigidly anchored by securing the holder 6 to a support frame (not shown), for example, whereas the furnace or kiln 8 located therebelow which heats the carrier 2 can be rotatable about the axis 9. After the carrier 2 and the semiconductor element 1 have attained the temperature necessary for alloying or soldering, the furnace 8 is rotated clockwise and counterclockwise about its vertical axis 9 until the alloying or soldering is sufficient. The clockwise and counterclockwise rotation can be carried out manually, for example, by means of the hand lever 10. After the semiconductor element and the carrier are alloyed or soldered, the heating oven 8 is cooled and the entrainer device is moved away from the carrier so that the carrier with the semiconductor element metallically bonded thereto can be removed from the heating oven.

Due to the small size of the semiconductor element it is often difficult to transport the semiconductor element to the location at which it is to be alloyed or soldered. It can, therefore, be advantageous with the apparatus of our invention to provide an inclined supply shaft or slideway 17 leading to a position between the points 5 of the pins 4 of the entraining device. The inclined supply shaft can be rotatable in the bearing 16, for example. A supply of semiconductor elements 15 can be located in a shaft 13 which can be supported by a holder 14 above the bearing 16. A suitably provided gate 18 can be actuated to feed successive semiconductor elements to the alloying or soldering location through the inclined shaft 17.

Further, in accordance with our invention, a relatively light compression piston 11 can be provided which can be pressed against the semiconductor element during the alloying or soldering operation in order to improve the contact between the semiconductor element and the carrier.

Figure 4:
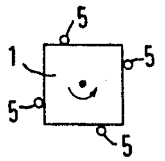
FIG. 4 is a plan view of a semiconductor component held by the four pins of the entrainer device shown in FIG. 1.

FIG. 4 is an enlarged plan view of a semiconductor component 1 held by the points 5 of the entrainer device embodiment shown in FIG. 3. The semiconductor element 1 can be displaced i.e. rotated by the points 5 with respect to the carrier, for example in the direction of the curved arrow (FIG. 4).

Figure 5:
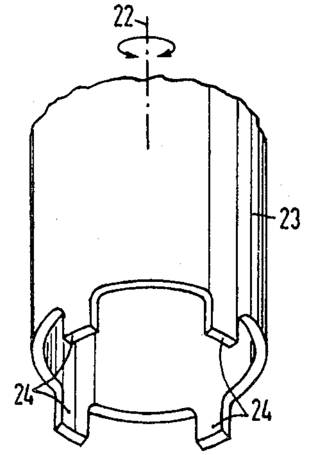
FIGS. 5 and 6 are a perspective view and a plan view respectively of a tube or rod formed with a crown-shaped lower end which serves as an entrainer device in accordance with our invention.
Figure 7:
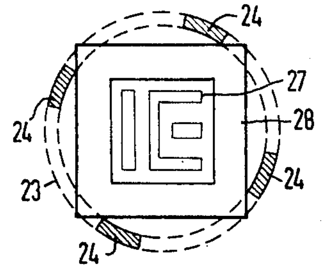
FIG. 7 is a plan view of a component held by the four projections or prongs at the end of the entrainer device shown in FIG. 5.

FIG. 5 shows an embodiment of an entrainer device in accordance with the invention which is formed out of the end of a tube. The lower end of the tube 23 can be so machined that the projections or teeth 24 form a crown-shaped edge of the tube. With the operation of the device shown in FIG. 5 as entrainer in an apparatus constructed in accordance with our invention, the tube 23 can be rotatable, for example, about the longitudinal axis 22 and can thereby clamp a semiconductor element 28 as shown in FIG. 7. It is believed to be clear from FIG. 7 that, on the one hand, relatively large tolerances are permitted for the diameter of the tube or the semiconductor element and that, on the other hand, the active portion of the semiconductor element, for example the contact pattern 27, is not at all engaged by the entrainer device. If it should be found to be advantageous to press the semiconductor element by means of a compression piston against the carrier in carrying out the alloying or soldering operation, whereby it is possible that the piston might then come into contact with the pattern 27, it cannot, however, cause any damage thereto because the piston does not have any relative motion with respect to the semiconductor element as compared to that described hereinabove with respect to the known types of apparatus.

Figure 6:
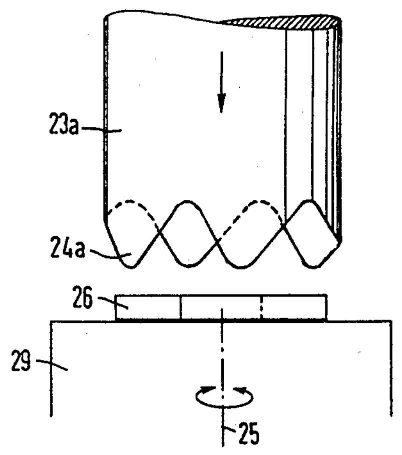

FIG. 6 shows an entrainer device similar to the embodiment of FIG. 5. It comprises a rod 23*a* which, for example, is ground at one of its ends parallel to two rod diameters which are perpendicular to one another so that projections or teeth 24*a* are formed. Below the entrainer device of FIG. 6 there is shown in elevational view a semiconductor platelet 26 lying on a carrier 29 which is rotatable about the axis 25. When the entrainer device 23*a* is moved in a downward direction indicated by the single-headed arrow, it clamps the semiconductor platelet 26 in a manner similar to that shown in FIG. 7 and holds it firmly while the carrier 29 rotates.

Figure 9:
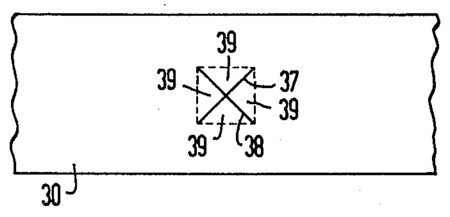
FIG. 9 is a sheet or plate formed with a cross-shaped cut for producing the embodiment of the entrainer device according to FIG. 8.
Figure 8:
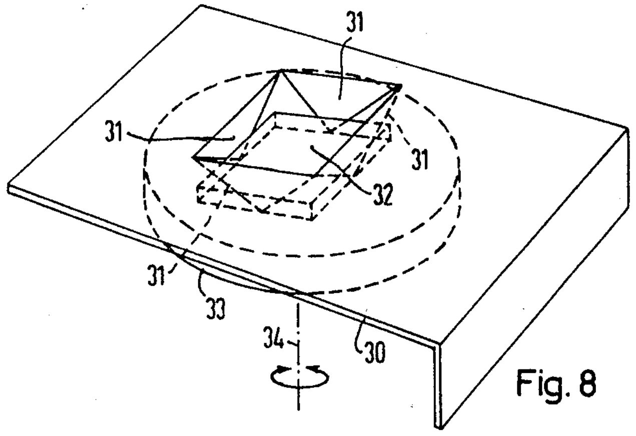
FIG. 8 is a perspective view of an entrainer device which is bent out of the surface of a plate.

In FIG. 8 there is shown an entrainer device wherein four outwardly bent edges from the surface of a sheet or plate 30, produces by a cross-shaped cut therein, are provided as the points 31 for holding the semiconductor platelet 32. Such a cross-shaped cut is illustrated in FIG. 9. The plate 30 is accordingly sliced along the lines 37 and 38 and the four triangular corners 39 which are formed are bent outwardly from the surface of the plate.

As indicated in FIG. 8, the semiconductor platelet is placed on a carrier 33 when being alloyed or soldered. The carrier 33 is heated to the alloying or soldering temperature by means of a heating oven, not illustrated in FIG. 8, and it is rotatable together with the heating oven about the axis 34 so that the metallic bond between the semiconductor element 32 and the carrier 33 is produced by friction soldering or friction alloying, i.e. the heat produced by rubbing the members together melts the alloying or soldering material.

In order to prevent the plate 30 and the points 31 thereof from dissipating too much heat from the semiconductor element, the plate is generally made of a material which is a poor heat conductor and is resistant to burning and is also kept as thin as possible, for example 0.1 to 0.2 mm. thick.

A common characteristic of the disclosed embodiments of the inventive apparatus of this application from which further apparatuses can be developed very readily, is that the surface of the semiconductor platelets cannot be damaged. (A possibly necessary compressive force would not undergo any relative motion with respect to the semiconductor element.) Furthermore, the entrainer device of this invention has considerable advantage over the known devices in that the tolerance between the dimensions of the semiconductor platelet and the spacing of the points of the entrainer device is not critical. For example, with quadrilateral semiconductor platelets, the tolerance can be up to 40% of the length of the sides or edges of the platelet.

We claim:

1. In apparatus for thermally bonding a substantially flat semiconductor element to a support, an entrainer device comprising means for holding the semiconductor element at the edges thereof, said entrainer device being rotatable relative to the support about an axis perpendicular to the semiconductor element.

2. Apparatus according to claim 1 wherein the semiconductor element is substantially rectangular, said holding means comprising four projections disposed symmetrically about said rotary axis.

3. Apparatus according to claim 2 wherein said four projections are formed at the lower end of a tube having a crown-shaped edge.

4. Apparatus according to claim 2 wherein said four projections constitute pins provided in a holder and offset substantially 90° from one another, said pins being disposed on the surface of an imaginary cone symmetrical to said rotary axis and tapering downward toward the semiconductor element.

5. Apparatus according to claim 4 including adjusting means for adjusting the position of said pins in the longitudinal direction thereof relative to said holder.

6. Apparatus according to claim 2 wherein said four projections consist of outwardly bent edge portions formed by a cross-shaped cut in a plate.

7. Apparatus according to claim 1 including means for applying a force to the semiconductor member, said means being movable conjointly with the semiconductor element as the element is thermally bonded to the support.

8. Apparatus according to claim 1 including a displaceable suction device for feeding the semiconductor elements to said entertainer device.

9. Apparatus according to claim 1 including a slideway for feeding the semiconductor elements to said entrainer device, said slideway having an outlet swingable to a location within said entrainer device.

10. Apparatus according to claim 1 including a slideway for feeding the semiconductor elements to said entrainer device, said slideway having a swingable outlet portion forming a part of said entrainer device.

References Cited

UNITED STATES PATENTS

| | | | |
|---|---|---|---|
| 3,255,511 | 6/1966 | Weissenstern et al. | 228—3.5 |
| 3,197,608 | 7/1965 | Ingraham | 219—85 |

RICHARD H. EANES, Jr., *Primary Examiner.*